(12) United States Patent
Lee

(10) Patent No.: US 7,265,981 B2
(45) Date of Patent: Sep. 4, 2007

(54) POWER SUPPLY WITH HEAT SINK

(76) Inventor: Cheng-Ping Lee, P.O. Box No. 6-57, Junghe, Taipei 235 (TW)

( * ) Notice: Subject to any disclaimer, the term of this patent is extended or adjusted under 35 U.S.C. 154(b) by 180 days.

(21) Appl. No.: 11/172,812

(22) Filed: Jul. 5, 2005

(65) Prior Publication Data

US 2007/0008700 A1    Jan. 11, 2007

(51) Int. Cl.
*H05K 7/20* (2006.01)
(52) U.S. Cl. .................. 361/707; 165/80.3; 165/185; 361/710; 361/715; 361/719; 361/690
(58) Field of Classification Search ............... 361/707, 361/715
See application file for complete search history.

(56) References Cited

U.S. PATENT DOCUMENTS 6,320,776 B1 *  11/2001  Kajiura et al. .............. 363/141
6,477,053 B1 *  11/2002  Zeidan et al. ............... 361/719
6,583,988 B1 *   6/2003  Lyons et al. ................ 361/719
7,154,755 B2 *  12/2006  Araujo ........................ 361/720
7,158,382 B2 *   1/2007  Fan et al. .................... 361/715
7,206,204 B2 *   4/2007  Nakatsu et al. ............. 361/703
2004/0246662 A1* 12/2004  Thurk et al. ................ 361/631
2005/0190539 A1*  9/2005  Watanabe et al. .......... 361/704
2006/0152907 A1*  7/2006  Rathmann ................... 361/720

* cited by examiner

*Primary Examiner*—Gregory Thompson

(57) ABSTRACT

A power supply with heat sink is mounted inside a computer, and includes a support, a circuit board arranged on a surface of the support, and a heat sink provided on another surface of the support. The support defines a slot substantially therein. A plurality of electronic components and a plurality of thermal components are respectively provided on opposite surfaces of the circuit board. The thermal components are evenly attached to the heat sink. The heat sink conducts and dissipates heat generated by the thermal components, thereby reducing noise and cooling large area. The power supply with heat sink is assembled flexibly for saving space.

8 Claims, 7 Drawing Sheets

POWER SUPPLY WITH HEAT SINK

BACKGROUND OF THE INVENTION (a) Field of the Invention

The present invention relates to a power supply with heat sink, and particularly to a power supply with heat sink which reduces noise and cools large area and which is assembled flexibly for saving space.

(b) Related Art

A power supply is ordinarily provided in a computer, as shown in FIG. 8, and comprises a casing 5 and a circuit board 6 in the casing 5. A plurality of electronic component 61 and thermal components 62 is provided on a surface of the circuit board 6. A heat sink 63 is retained on the thermal components 62. A fan 51 is arranged on a surface of the casing 5. The heat sink 63 conducts heat generated by the thermal components 62 and radiates it inside the casing 5. The fan 51 forces heated air out of the casing 5, thereby dissipating heat.

However, the casing 5 is entirely closed, and heated air therein often can not be dissipated timely, making the heat sink 63 overheated. In the event, the heat sink 63 in the closed casing 5 fails to work effectively to dissipate heat. Furthermore, the fan 51 often produces noise when it operates and tends to damage because of overwork. The casing 5 has fixed size, and can not be mounted flexibly, occupying a certain space interior a computer.

SUMMARY OF THE INVENTION

Accordingly, an object of the present invention is to provide a power supply with heat sink which has a support to cooperate with a circuit board and a heat sink, wherein thermal components on the circuit board are evenly attached to the heat sink, and the heat sink conducts and dissipates heat generated by the thermal components, thereby reducing noise and cooling large area, and which is assembled flexibly for saving space.

The power supply with heat sink of the present invention is mounted inside a computer, and includes a support, a circuit board arranged on a surface of the support, and a heat sink provided on another surface of the support. The support defines a slot substantially in a middle thereof. A plurality of electronic components is provided on a surface of the circuit board, and a plurality of thermal components is provided on another surface of the circuit board and accommodated in the slot of the support. The thermal components are evenly attached to the heat sink.

DESCRIPTION OF THE PREFERRED EMBODIMENTS

Figure 1:
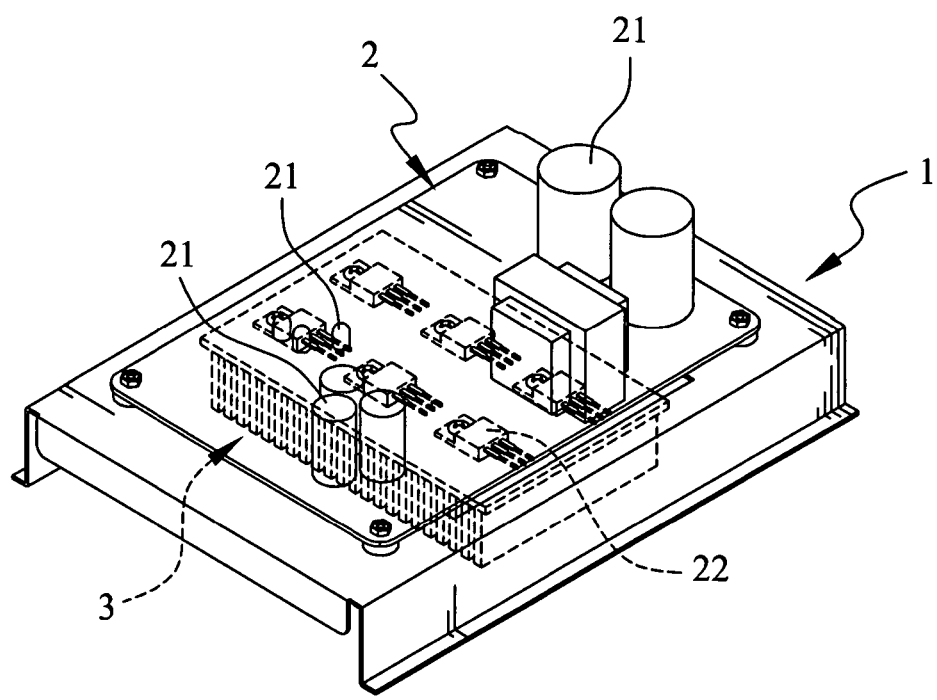
FIG. 1 is a perspective view of a power supply with heat sink according to the present invention.
Figure 2:
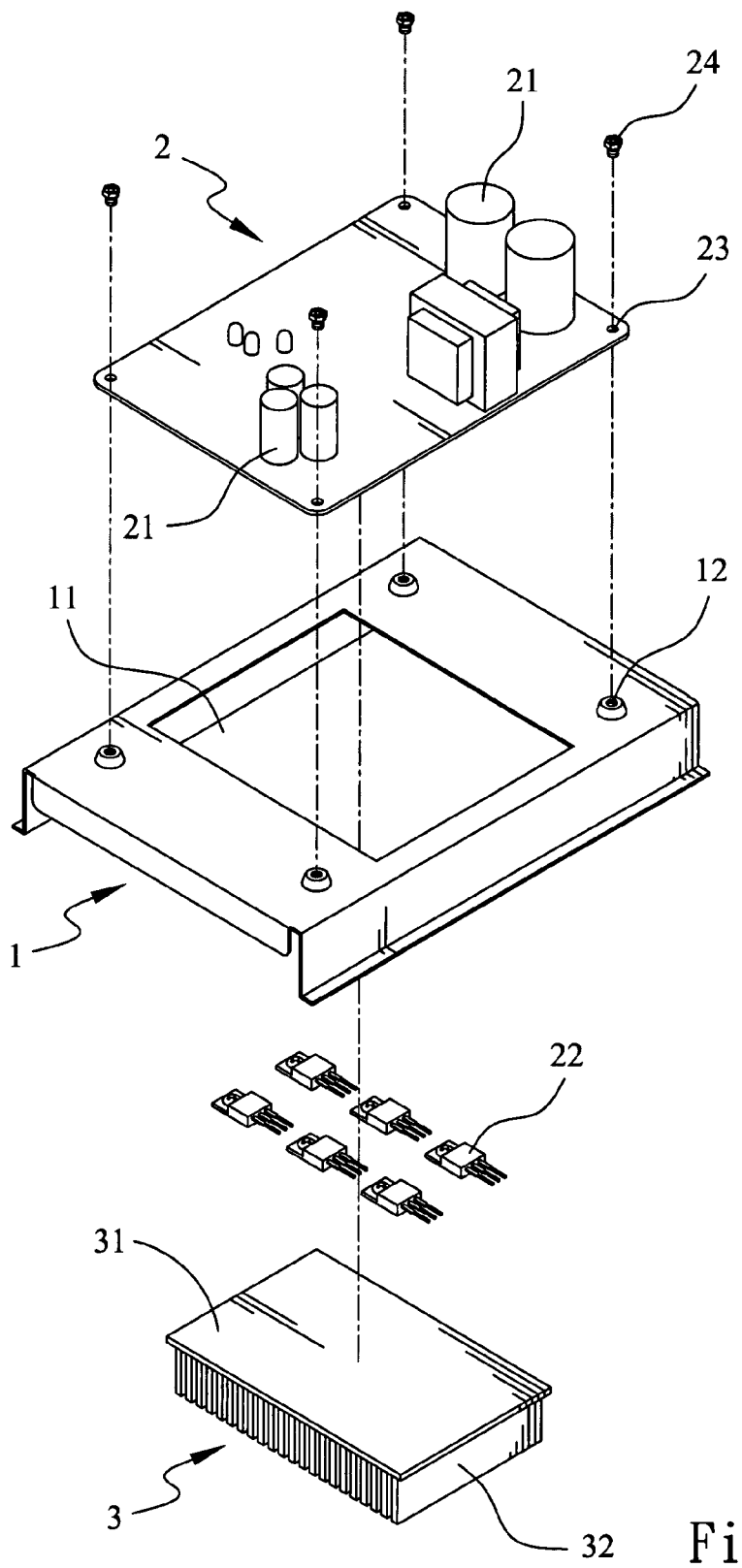
FIG. 2 is an exploded view of the power supply with heat sink.
Figure 3:
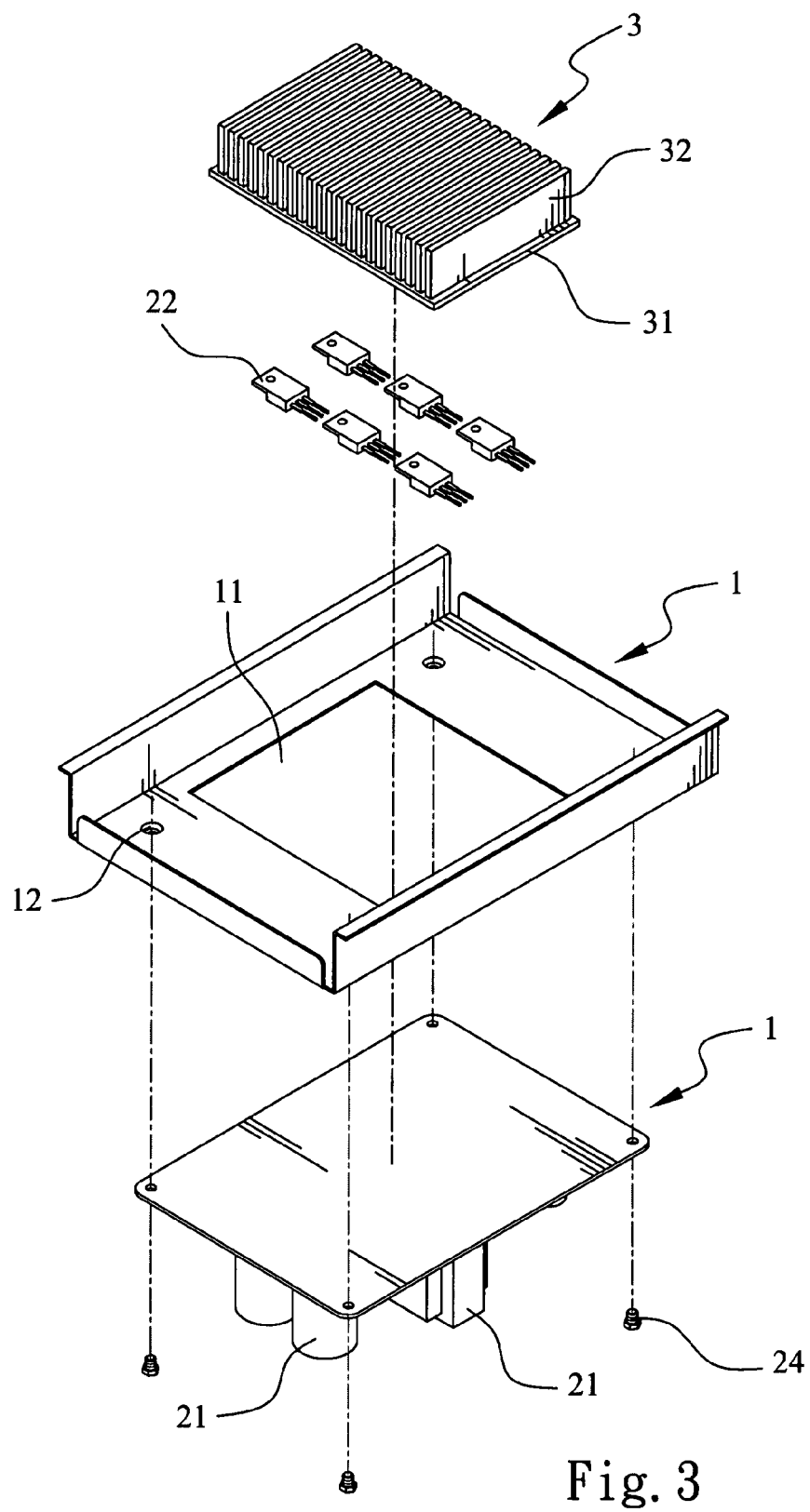
FIG. 3 is another exploded view of the power supply with heat sink from another aspect.
Figure 4:
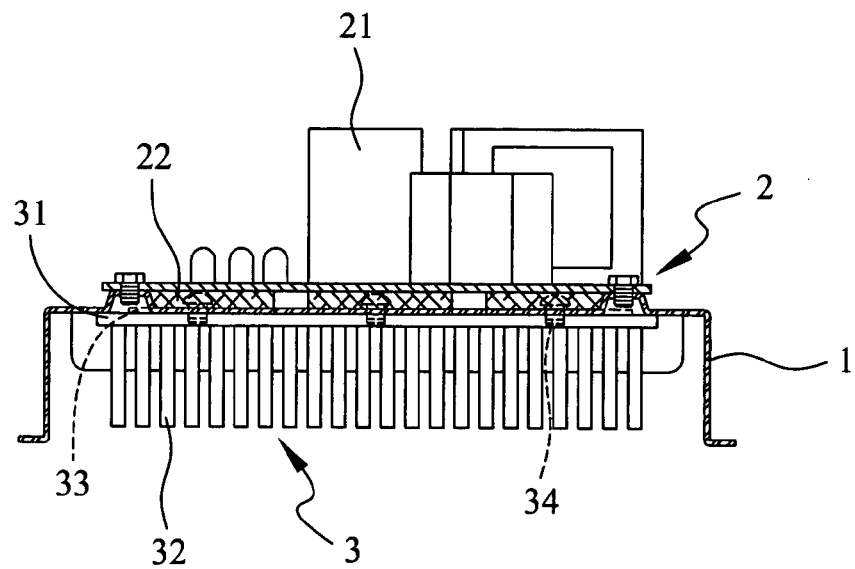
FIG. 4 is a cross-sectional view taken along the line 3-3 of FIG. 2.

With reference to FIGS. 1 through 4, a power supply with heat sink in accordance with the present invention is provided inside a computer, and comprises a support 1, a circuit board 2 and a heat sink 3. The heat sink 3 conducts heat generated by thermal components and dissipates heat out of the computer. The power supply with heat sink reduces noise and cools large area. Furthermore, the power supply with heat sink is mounted flexibly and effectively minimizing occupied space.

The support 1 has an inverted-U shape, and defines a slot 11 substantially in a middle thereof. A plurality of engaging holes 12 is defined around the slot 11.

The circuit board 2 is arranged on a surface of the support 1. A plurality of electronic components 21 is provided on a surface of the circuit board 2, and a plurality of thermal components 22 is provided on another surface of the circuit board 2. The thermal components 22 are accommodated in the slot 11. A plurality of through holes 23 is defined in the circuit board 2 for corresponding to the engaging holes 12. Fixing elements 24 extend through the engaging holes 12 and the through holes 23 to fasten the circuit board 2 and the support 1 securely.

The heat sink 3 includes a base 31 and a plurality of fins 32 extending from the base 31. The heat sink 3 is provided on a surface of the support 1 and is opposite to the circuit board 2. The thermal components 22 are evenly attached to the base 31 of the heat sink 3. A conductive layer 33 is sandwiched between the base 31 and the thermal components 22. Fixing components 34 fix the thermal components 22 onto the base 31.

Figure 5:
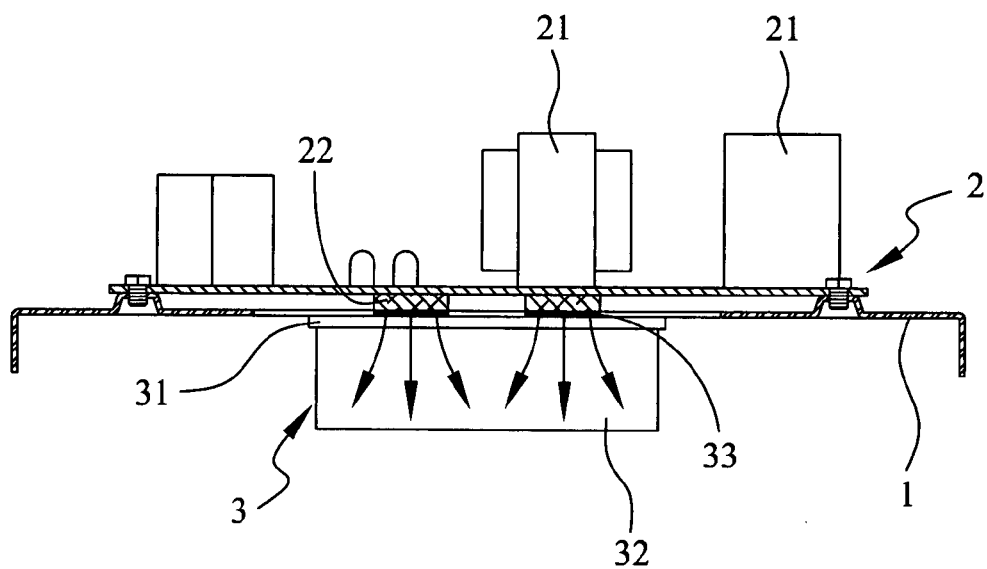
FIG. 5 is the first cross-sectional view of the power supply with heat sink in use.

In use, referring to FIG. 5, due to the support 1, the power supply with heat sink may be assembled at random place in the computer. The power supply with heat sink is capable of being mounted flexibly, suppressing the need of occupying large space inside the computer. When the power supply with heat sink works, the thermal components 22 generate heat. The conductive layer 33 directly conducts the heat generated by the thermal components 22 to the base 31. The base 31 conducts the heat to the fins 32 thereby radiating the heat. Thus, the power supply with heat sink decreases noise and cools large area.

Figure 6:
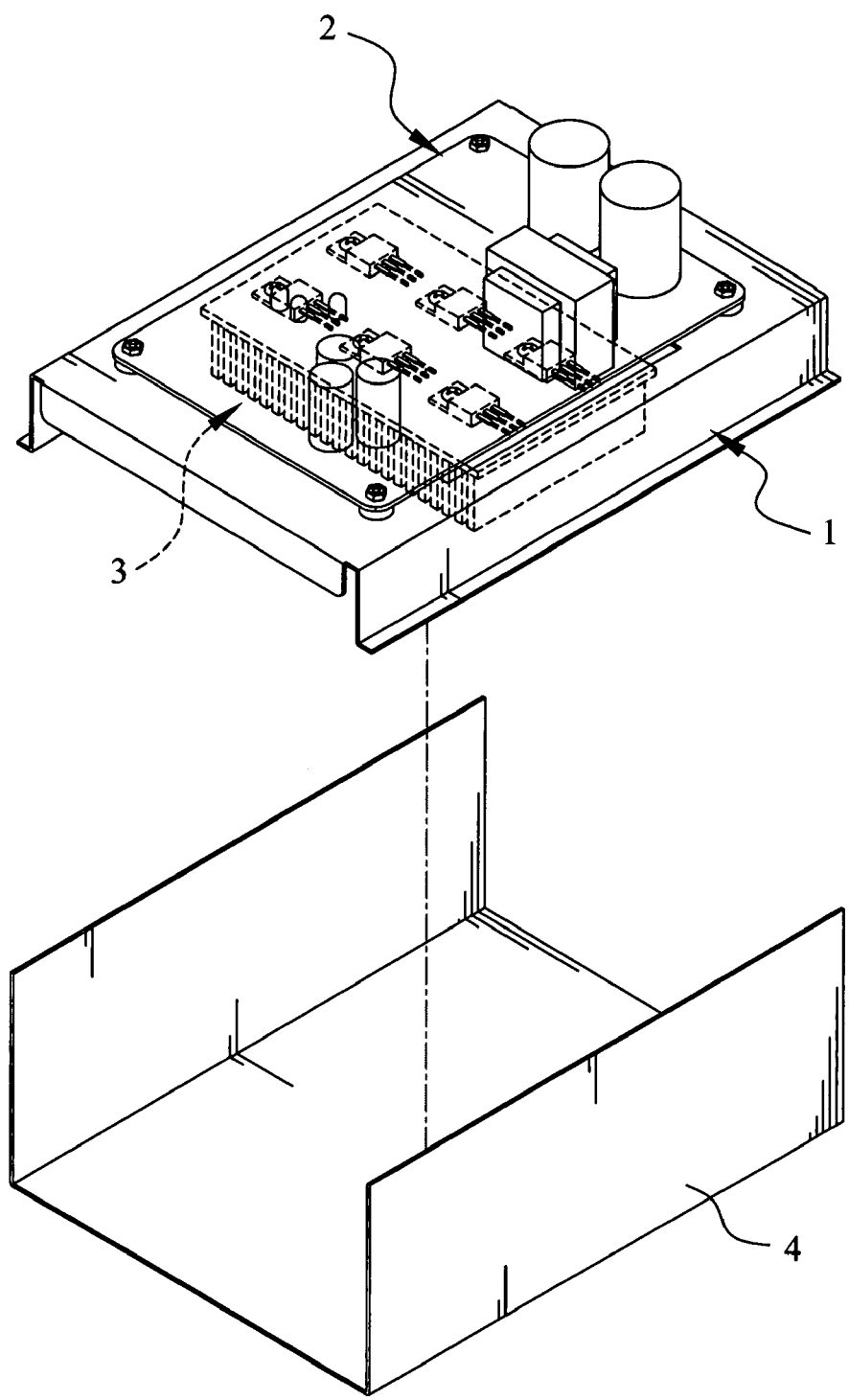
FIG. 6 is the second cross-sectional view of the power supply with heat sink in use.
Figure 7:
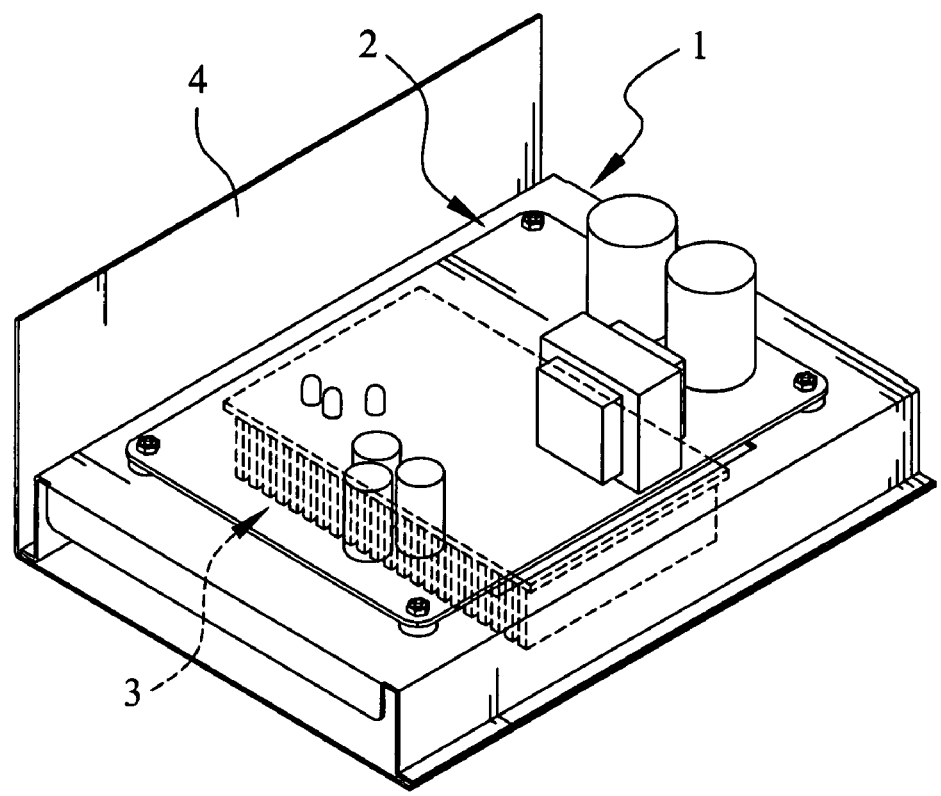
FIG. 7 is the third cross-sectional view of the power supply with heat sink in use.
Figure 8:
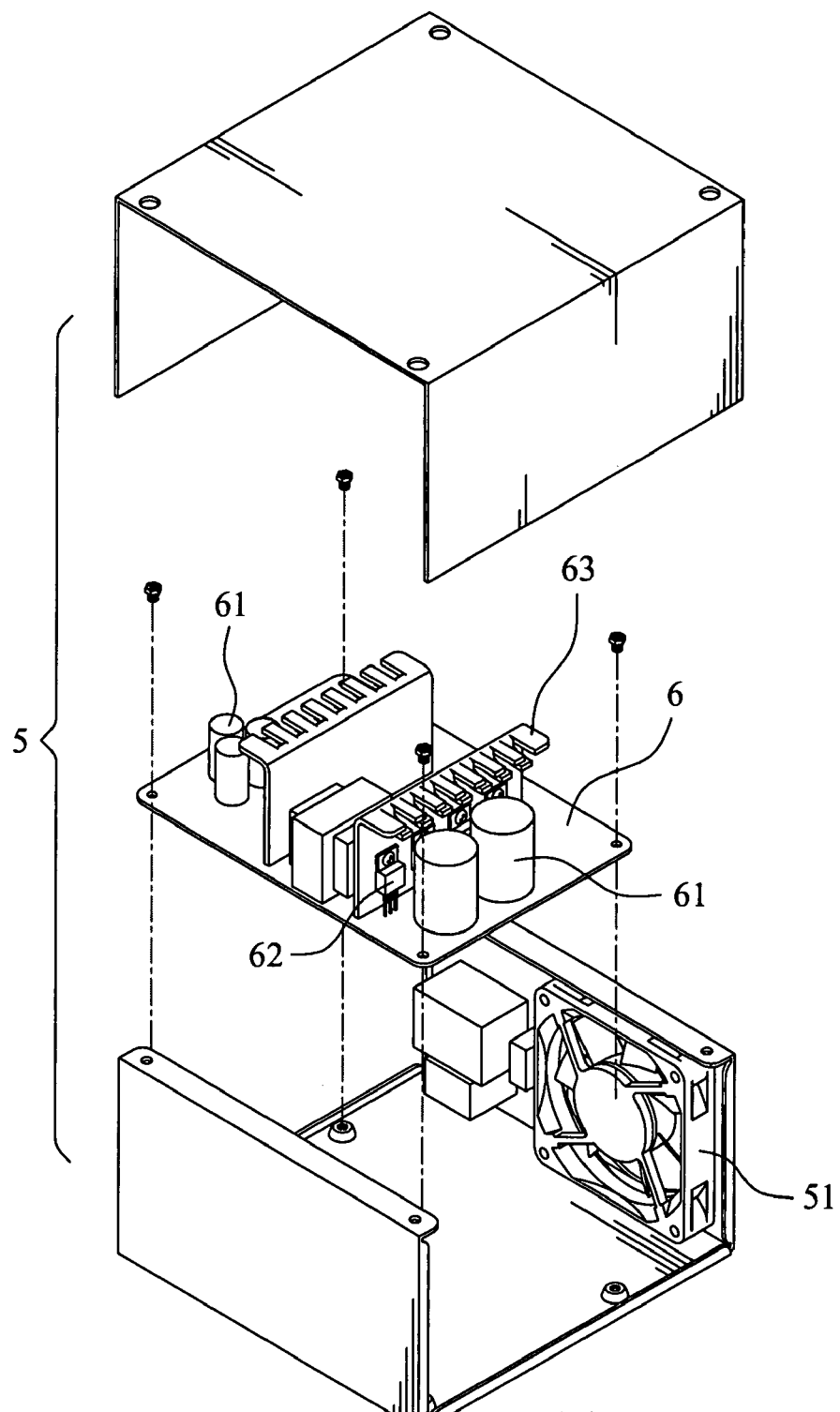
FIG. 8 is an exploded view of a conventional power supply with heat sink.

Referring to FIGS. 6 and 7, the support 1 is alternatively mounted on a casing 4 which is mounted inside the computer. The casing 4 may be U-shaped or L-shaped. The support 1 is able to be mounted on any surface of the casing 4 as desired for flexible assembly, thereby effectively suppressing the need of occupying large space inside the computer.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A power supply with heat sink comprising:
   a support having a slot substantially in a middle thereof;
   a circuit board arranged on a surface of the support, a plurality of electronic components being provided on a surface of the circuit board, and a plurality of thermal components being provided on another surface of the circuit board and being accommodated in the slot of the support; and the heat sink provided on a surface of the support and opposite to the circuit board, the thermal components being evenly attached to the heat sink.

2. The power supply With heat sink as claimed in claim 1, wherein the support has an inverted-U shape.

3. The power supply with heat sink as claimed in claim 1, wherein the support is mounted on a U-shaped casing.

4. The power supply with heat sink as claimed in claim 1, wherein the support is mounted on an L-shaped casing.

5. The power supply with heat sink as claimed in claim 1, wherein the support defines a plurality of engaging holes, and wherein the circuit board defines a plurality of through holes for corresponding to the engaging holes, fixing elements extending through the engaging holes and the through holes to fasten the circuit board and the support.

6. The power supply with heat sink as claimed in claim 1, wherein fixing components are provided to fix the thermal components onto the heat sink.

7. The power supply with heat sink as claimed in claim 1, wherein a conductive layer is sandwiched between the heat sink and the thermal components.

8. The power supply with heat sink as claimed in claim 1, wherein the heat sink includes a base and a plurality of fins extending from the base.

* * * * *